United States Patent
An et al.

(10) Patent No.: US 8,125,276 B2
(45) Date of Patent: Feb. 28, 2012

(54) SHARING OF INDUCTOR INTERSTAGE MATCHING IN PARALLEL AMPLIFICATION SYSTEM FOR WIRELESS COMMUNICATION SYSTEMS

(75) Inventors: Kyu Hwan An, Irvine, CA (US); Yunseo Park, Norcross, GA (US); Wangmyong Woo, Cumming, GA (US); Chang-Ho Lee, Marietta, GA (US)

(73) Assignee: Samsung Electro-Mechanics, Gyunngi-Do (KR)

( * ) Notice: Subject to any disclaimer, the term of this patent is extended or adjusted under 35 U.S.C. 154(b) by 0 days.

(21) Appl. No.: 12/722,993

(22) Filed: Mar. 12, 2010

(65) Prior Publication Data

US 2011/0221522 A1    Sep. 15, 2011

(51) Int. Cl.
*H03F 3/68* (2006.01)
*H03F 3/191* (2006.01)

(52) U.S. Cl. .................. 330/295; 330/165; 330/302

(58) Field of Classification Search ............ 330/124 R, 330/165, 295, 302
See application file for complete search history.

(56) References Cited

U.S. PATENT DOCUMENTS

| | | | |
|---|---|---|---|
| 2,710,312 A | 6/1955 | Hafler et al. | |
| 3,060,266 A | 10/1962 | Dow | |
| 4,105,941 A | 8/1978 | Routh | |
| 4,994,760 A | 2/1991 | Roehrs | |
| 5,091,703 A | 2/1992 | Schenk | |
| 5,543,773 A | 8/1996 | Evans et al. | |
| 5,796,165 A | 8/1998 | Yoshikawa et al. | |
| 5,974,041 A | 10/1999 | Kornfeld et al. | |
| 6,097,273 A | 8/2000 | Frye et al. | |
| 6,323,686 B1 | 11/2001 | Bisson et al. | |
| 6,396,362 B1 | 5/2002 | Mourant et al. | |
| 6,462,950 B1 | 10/2002 | Pohjonen | |
| 6,466,094 B2 | 10/2002 | Leighton et al. | |
| 6,476,704 B2 | 11/2002 | Goff | |
| 6,577,219 B2 | 6/2003 | Visser | |
| 6,614,308 B2 | 9/2003 | Moller et al. | |
| 6,674,632 B2 | 1/2004 | Kiewitt et al. | |
| 6,731,166 B1 | 5/2004 | Sabouri et al. | |
| 6,737,916 B2 | 5/2004 | Luu | |
| 6,791,407 B2 * | 9/2004 | Grebennikov et al. | 330/133 |
| 6,798,295 B2 | 9/2004 | Pengelly et al. | |
| 6,818,979 B2 | 11/2004 | Takehara et al. | |
| 6,882,263 B2 | 4/2005 | Yang et al. | |
| 6,885,275 B1 | 4/2005 | Chang | |

(Continued)

FOREIGN PATENT DOCUMENTS

EP   1677415 A1   5/2006

(Continued)

OTHER PUBLICATIONS

First Office Action for Chinese Patent Application No. 200810001009.9 dated Apr. 21, 2010.

(Continued)

*Primary Examiner* — Steven J Mottola (57) ABSTRACT

A power amplifier system can include a plurality of driver amplifiers and a plurality of power amplifiers, where each driver amplifier and power amplifier includes at least one respective input port and at least one respective output port. The power amplifier system also includes a shared inductive device that provides common interstage matching between the respective output ports of the plurality of driver amplifiers and the respective input ports of the plurality of power amplifiers. The shared inductive device can be a shared inductor or a shared transformer.

18 Claims, 6 Drawing Sheets

U.S. PATENT DOCUMENTS

| | | | |
|---|---|---|---|
| 7,061,329 B2 | 6/2006 | Inoue et al. | |
| 7,091,791 B1 | 8/2006 | Terrovitis | |
| 7,091,813 B2 | 8/2006 | Liang et al. | |
| 7,092,678 B2 | 8/2006 | Shih | |
| 7,129,784 B2 | 10/2006 | Bhatti et al. | |
| 7,157,965 B1 | 1/2007 | Kim | |
| 7,157,966 B2 | 1/2007 | Baree et al. | |
| 7,176,579 B2 | 2/2007 | Konishi et al. | |
| 7,192,788 B2 | 3/2007 | Kurokawa | |
| 7,242,245 B2 | 7/2007 | Burns et al. | |
| 7,260,152 B2 | 8/2007 | Golo | |
| 7,276,420 B2 | 10/2007 | Liu et al. | |
| 7,288,995 B2 | 10/2007 | Vaisanen | |
| 7,348,656 B2 | 3/2008 | Briere | |
| 7,365,602 B2 | 4/2008 | Bhatti et al. | |
| 7,414,507 B2 | 8/2008 | Giandalia et al. | |
| 7,425,869 B2 | 9/2008 | Aoki et al. | |
| 7,486,167 B2 | 2/2009 | Loke et al. | |
| 7,728,661 B2 * | 6/2010 | Bockelman et al. | 330/51 |
| 7,872,528 B2 * | 1/2011 | Bockelman et al. | 330/149 |
| 2003/0132801 A1 | 7/2003 | Grebennikov et al. | |
| 2006/0091958 A1 | 5/2006 | Bhatti et al. | |
| 2006/0284685 A1 | 12/2006 | Vaisanen | |
| 2007/0046371 A1 | 3/2007 | Barabash et al. | |
| 2007/0069717 A1 | 3/2007 | Cheung et al. | |
| 2008/0164941 A1 | 7/2008 | Lee et al. | |
| 2008/0284553 A1 | 11/2008 | Lim et al. | |

FOREIGN PATENT DOCUMENTS

| | | |
|---|---|---|
| GB | 2269057 A | 1/1994 |
| GB | 2445677 A | 7/2008 |
| JP | 2003506915 A | 2/2003 |
| KR | 1020030061697 A | 7/2003 |
| WO | WO 0110053 A1 | 2/2001 |

OTHER PUBLICATIONS

Combined Search and Examination Report dated Apr. 30, 2009 for Application No. GB0823679.6.
Combined Search and Examination Report dated May 1, 2009 for Application No. GB0900056.3.
Search Report dated Mar. 18, 2008 for GB0800400.4.
Notice of Allowance dated Jul. 13, 2009 for U.S. Appl. No. 11/968,862.
Notice of Allowance dated Mar. 9, 2009 for U.S. Appl. No. 11/968,862.
Notice of Allowance dated Mar. 22, 2010 for U.S. Appl. No. 12/138,188.
Non-Final Office Action dated Sep. 11, 2009 for U.S. Appl. No. 12/138,188.
Notice of Allowance dated Dec. 1, 2009 for U.S. Appl. No. 11/964,646.
Non-Final Office Action dated Aug. 21, 2009 for U.S. Appl. No. 11/964,646.
Non-Final Office Action dated Feb. 27, 2009 for U.S. Appl. No. 11/964,646.
Non-Final Office Action dated Dec. 31, 2009 for U.S. Appl. No. 12/416,268.
Final Office Action dated Jan. 5, 2010 for U.S. Appl. No. 11/970,995.
Non-Final Office Action dated Jul. 8, 2009 for U.S. Appl. No. 11/970,995.
Notice of Allowance dated May 21, 2010 for U.S. Appl. No. 11/970,995.
Office Action from Korean Application No. KR10-2010-0064994 dated Jun. 3, 2011.

* cited by examiner

SHARING OF INDUCTOR INTERSTAGE MATCHING IN PARALLEL AMPLIFICATION SYSTEM FOR WIRELESS COMMUNICATION SYSTEMS

FIELD OF INVENTION

Embodiments of the invention relate generally to power amplifiers, and more particularly, to systems and methods for sharing of inductor interstage matching in a parallel amplification system.

BACKGROUND OF THE INVENTION

The size of implementation in integrated circuits can significantly affect the cost of manufacture. One of the key design blocks in integrated circuits is the inductor, which are often considered an area-consuming component due to the inductor's planar shape. Therefore, the number of inductors included with an integrated circuit should be minimized in order to reduce the overall size of the integrated circuit.

Figure 1:
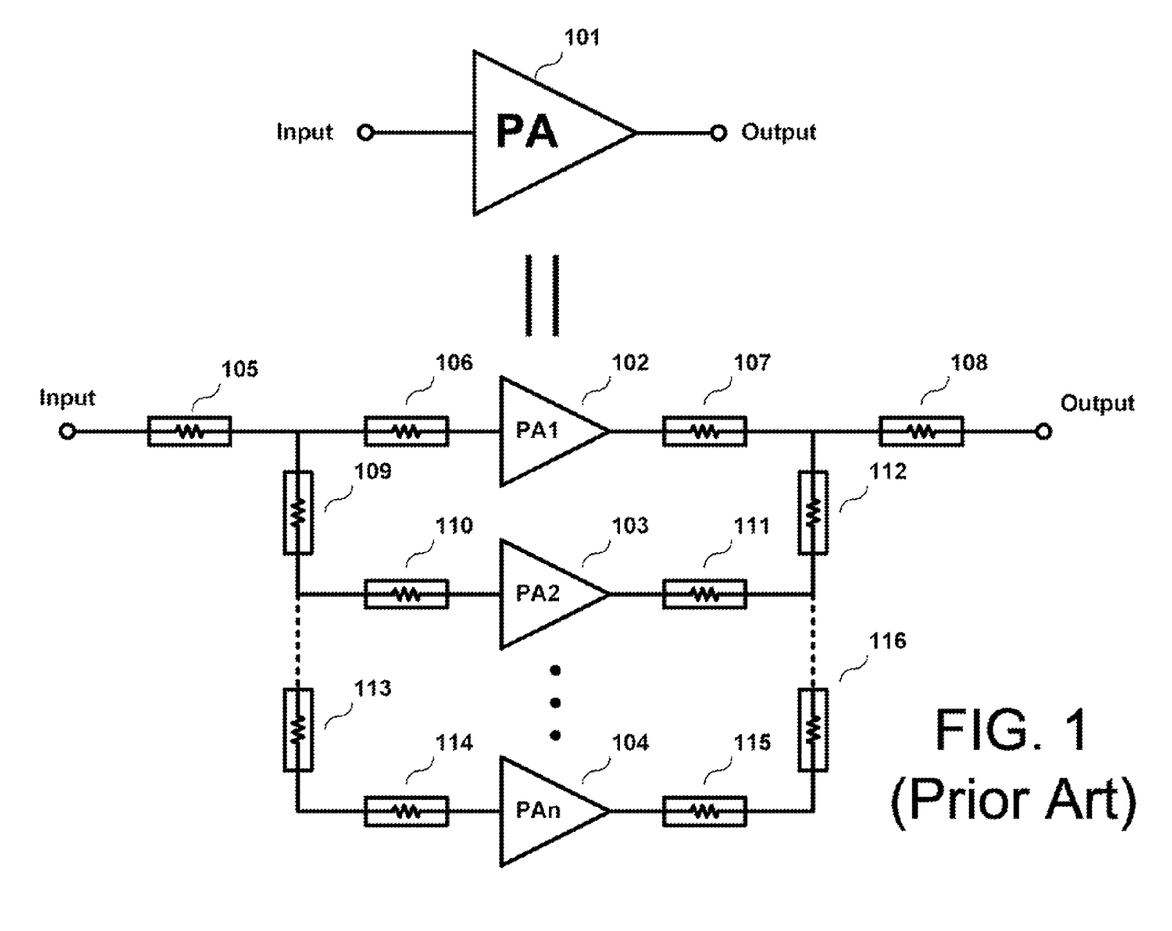
FIG. 1 illustrates an implementation of a conventional large power amplifier.

FIG. 1 illustrates an implementation of a large power amplifier 101. In particular, the large power amplifier is implemented using multiple power amplifiers 102, 103, 104 in which the respective inputs and outputs are directly connected to each other. The interconnections of the inputs of power amplifiers 102, 103, 104 result in large parasitic elements 105, 106, 109, 110, 113, and 114 being present at the inputs, thereby resulting in uneven driving of the power amplifiers 102, 103, 104. Likewise, parasitic elements 107, 108, 111, 112, 115, 116 would also be present at the outputs of power amplifiers 102, 103, 104.

Parallel amplification power amplifiers have been utilized to attempt to overcome one or more of the deficiencies described with respect to FIG. 1. In the design of power amplifiers in parallel amplification in CMOS technologies, each power amplification path requires inductive interstage matching between the corresponding driver and the power stages due to each CMOS devices' capacitive input characteristics. Thus, the number of inductive interstage matching components increases in accordance with a similar increase in the number of parallel amplifications paths. Having a large number of interstage matching inductors would consume a large area, thereby increasing the cost of implementation.

Figure 2A:
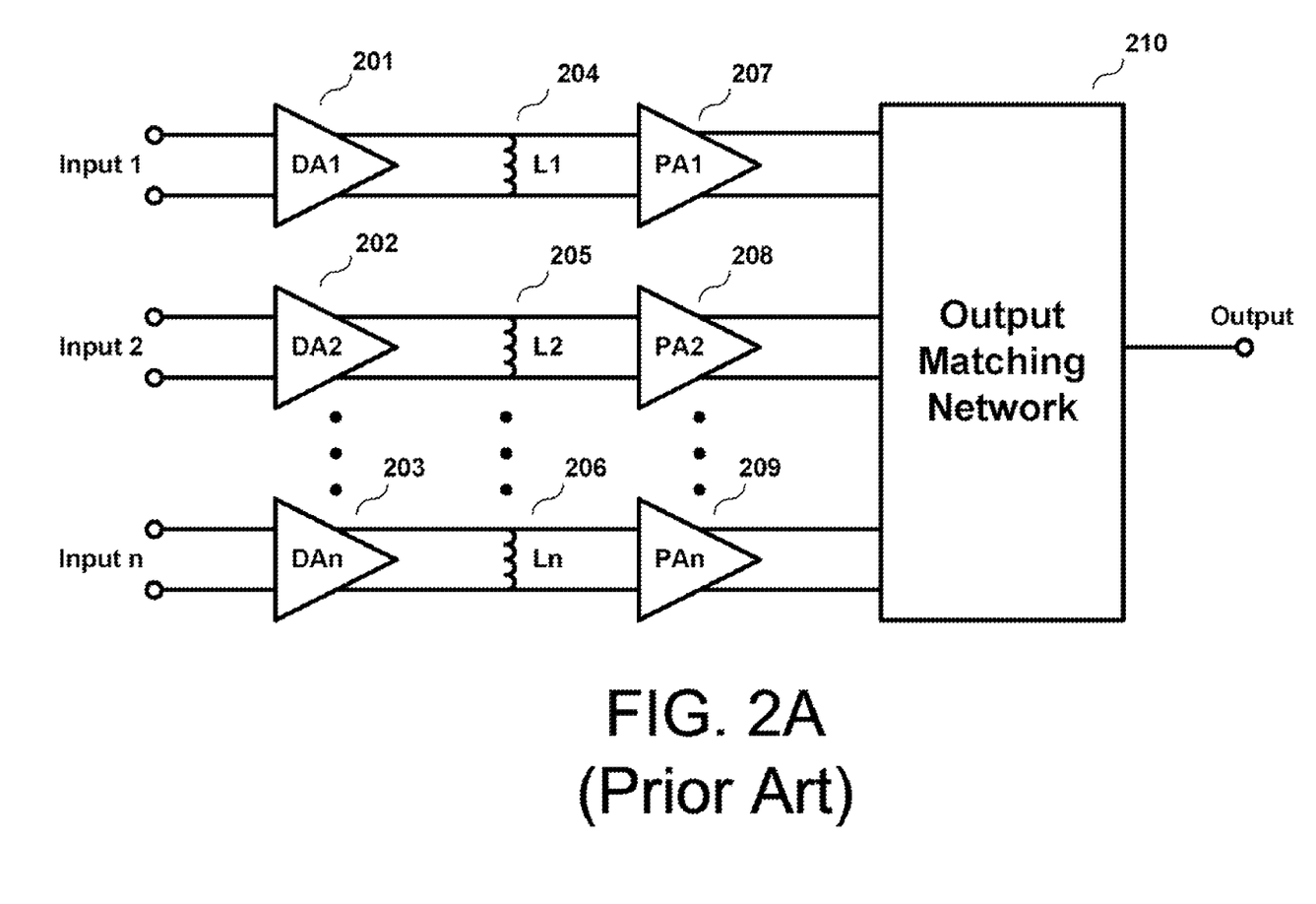
FIG. 2A illustrates a block diagram of a conventional parallel power amplification system using inductors for interstage matching.

As an example, FIG. 2A illustrates a conventional power amplifier system that includes multiple power amplifiers 207, 208, 209 and an output matching network 210. Cascode amplifications for high gain require driver amplifiers 201, 202, 203 in which their respective outputs need to be matched to the respective inputs of power amplifier amplifiers 207, 208, 209. In CMOS designs, the matching is typically performed by inductive components due to the capacitive nature of CMOS devices. These inductive components can be inductors 204, 205, and 206. It will be appreciated that the use of multiple respective inductors 204, 205, 206 for matching can consume significant area in an implementation of an integrated circuit.

Figure 2B:
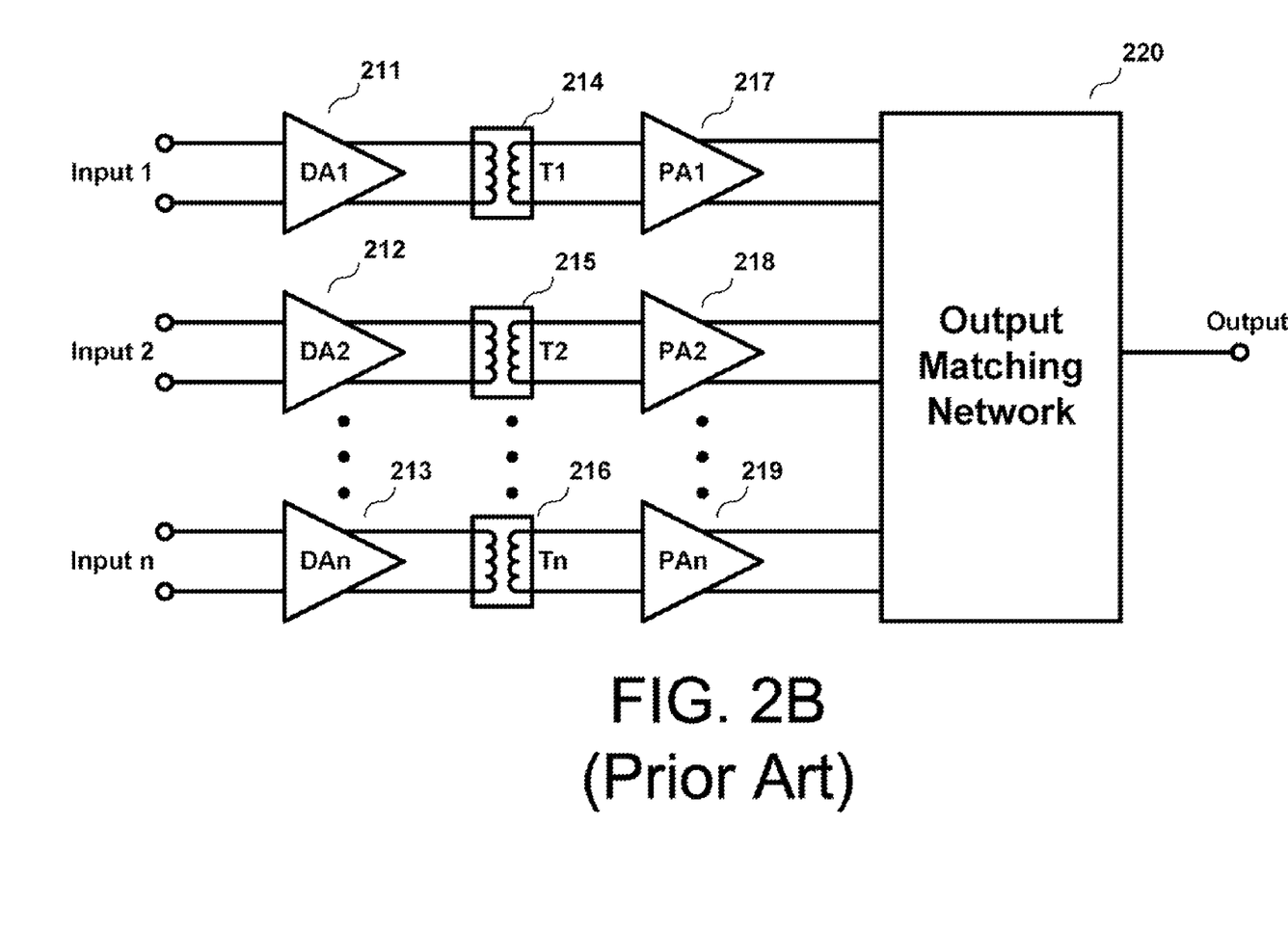
FIG. 2B illustrates a block diagram of a conventional parallel power amplification system using transformers for interstage matching.

FIG. 2B illustrates another conventional power amplifier system similar to that of FIG. 2B. In particular, there are multiple power amplifier driver amplifiers 211, 212, 213, and a corresponding number of power amplifiers 217, 218, 219. Likewise, there is an output matching network 220. However, the matching between the respective outputs of driver amplifiers 211, 212, 213 and respective inputs of power amplifiers 217, 218, 219 is based upon respective transformers 214, 215, 216. It will be appreciated that the use of multiple respective transformers 214, 215, 216 for matching can consume significant area in an implementation of an integrated circuit.

Therefore, there is a need in the industry for the sharing of inductor interstage matching in a parallel amplification system.

BRIEF SUMMARY OF THE INVENTION

According to an example embodiment of the invention, there is a power amplifier system. The system may include a plurality of driver amplifiers, where each driver amplifier includes at least one respective input port and at least one respective output port, and a plurality of power amplifiers, where each power amplifier includes at least one respective input port and at least one respective output port. The system may also include a shared inductor that provides common interstage matching between the respective output ports of the plurality of driver amplifiers and the respective input ports of the plurality of power amplifiers.

According to another example embodiment of the invention, there is a power amplifier system. The system may include a plurality of driver amplifiers, where each driver amplifier includes at least one input port and at least one output port, and a plurality of power amplifiers, wherein each power amplifier includes at least one input port and at least one output port. The system may also include a shared transformer that provides common interstage matching between the respective output ports of the plurality of driver amplifiers and the respective input ports of the plurality of power amplifiers.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 3:
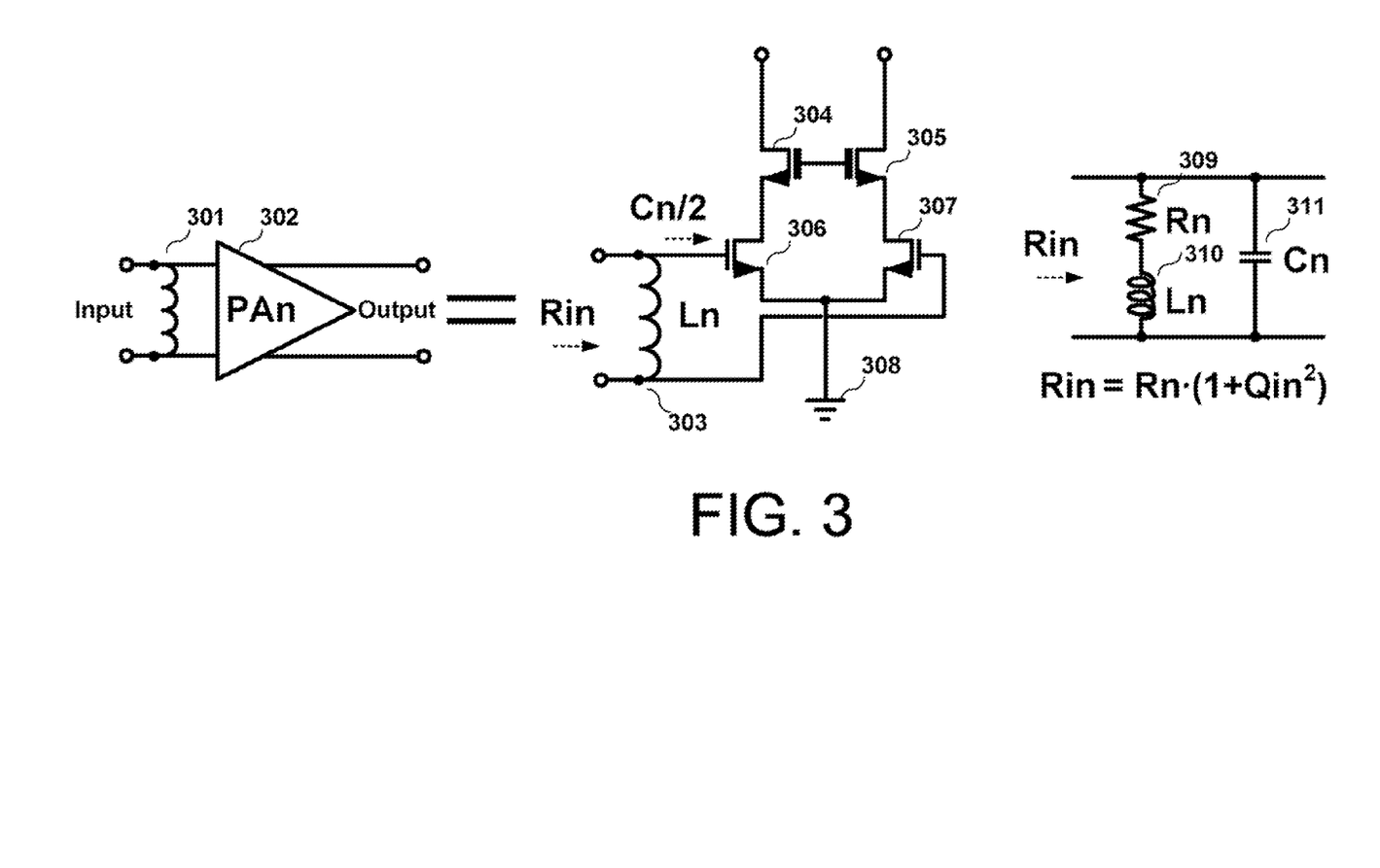
FIG. 3 illustrates an example input impedance for a power amplifier implemented in CMOS technologies, according to an example embodiment of the invention.

FIG. 3 illustrates an example input impedance for a power amplifier stage implemented in CMOS technologies, according to an example embodiment of the invention. It will be appreciated that while FIG. 3 illustrates a single power stage, it is representative of one of a plurality of n power stages that may operate in parallel for parallel amplification, according to an example embodiment of the invention.

As shown in FIG. 3, there is a CMOS power amplifier 302 (e.g., PAn) having differential input and output ports. The input capacitance looking into the power amplifier 302 can be matched by adding an inductive matching element 301. The CMOS power amplifier 302 can be built in a cascade configuration that that stacks two or more transistors (e.g., stacked transistors 304, 306 or 305, 307) to avoid voltage stress to each transistor. More specifically, in FIG. 3, there is a first cascade stage comprising stacked transistors 304, 306 and a second cascade stage comprising stacked transistors 305, 307. As such, the drain of transistor 306 may be connected to the source of transistor 304 while the drain of transistor 307 may be connected to the source of transistor 305.

In addition, the CMOS power amplifier 302 can be built in a differential configuration (e.g., provided by transistors 306, 307) to avoid substrate bouncing that can happen in the ground 308 resulting from an undefined ground of CMOS substrate. According to this differential configuration, the differential input ports are provided via the respective gates of transistors 306, 307. Likewise, the respective sources of transistors 306, 307 are connected to ground 308. The gates of transistors 304, 305 are connected to each other. The drains of 304, 305 may provide the differential output ports for the CMOS power amplifier 302.

The input capacitances looking into the transistors 306, 307 are usually dominated by capacitive elements so that they should be matched by adding an inductive element 303, thereby resulting in resonance at the operation frequency, according to an example embodiment of the invention. At the resonance frequency, the input impedance ($R_{in}$) can be represented in a simple form as a resistor 309 ($R_n$), an inductor 310 ($L_n$), and a capacitor 311 ($C_n$), with the quality factor $Q_{in}=2*\pi*f*L_n/R_n$, where $R_n$ is the intrinsic resistance of resistor 309. Thus, the input impedance ($R_{in}$) can be represented as $R_{in}=R_n*(1+Q_{in}^2)$.

When the power amplifier 302 is being driven at its input, the total required inductance ($L_A$) may be as follows: $L_A=L_1+L_2+\ldots+L_n=n*L_n$, when $L_1=L_2=\ldots=L_n$, wherein n represents the number of parallel power stages that will share common interstage matching, as described in further detail herein. Each inductor 310 has a resonance with each power stage with the following operational frequency: $f_0=1/(2*\pi*(C_n*L_n)^{1/2})$.

It will be appreciated that one or more of the transistors illustrated in FIG. 3 may be MOSFETs. However, other FETs may similarly be utilized without departing from example embodiments of the invention.

Figure 4:
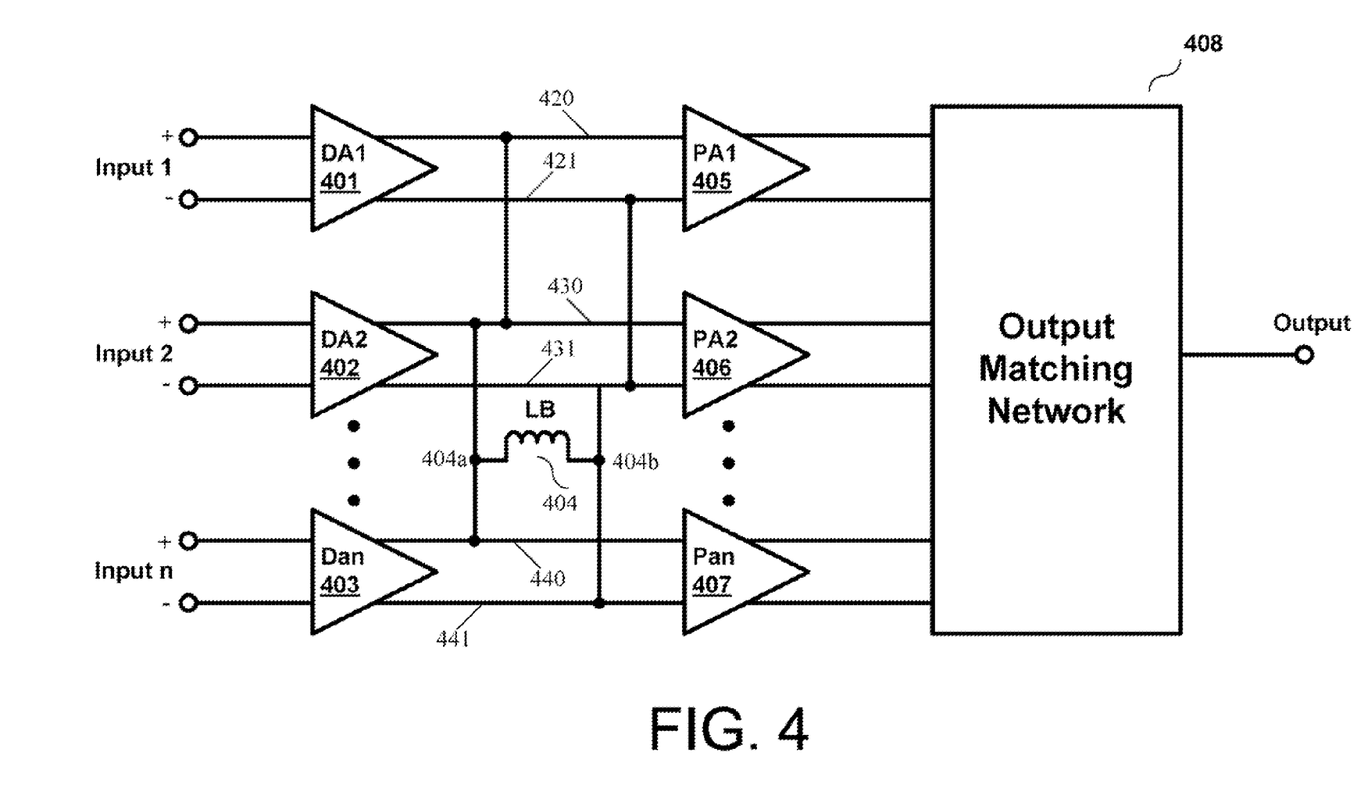
FIG. 4 illustrates an example power amplifier system in which a shared inductor is utilized for interstage matching for a plurality of parallel amplification paths, according to an example embodiment of the invention.

FIG. 4 illustrates an example power amplifier system in which a shared inductor 404 is utilized for interstage matching for a plurality of parallel amplification paths, according to an example embodiment of the invention. As shown in FIG. 4, for parallel amplification, the respective differential output ports of respective driver amplifiers 401, 402, 403 are connected to respective differential input ports of respective power amplifiers 405, 406, 407. More specifically, a first positive output port of driver amplifier 401 is connected by electrical path 420 to a first positive input port of power amplifier 405, and a second negative output port of driver amplifier 401 is connected by electrical path 421 to a second negative input port of power amplifier 405. Likewise, a first positive output port of driver amplifier 402 is connected by electrical path 430 to a first positive input port of power amplifier 406, and a second negative output port of driver amplifier 402 is connected by electrical path 431 to a second negative input port of power amplifier 406. Similarly, a first positive output port of driver amplifier 403 is connected by electrical path 440 to a first positive input port of power amplifier 407, and a second negative output port of driver amplifier 403 is connected by electrical path 441 to a second negative input port of power amplifier 407.

However, instead of using separate matching inductor for each driver and power amplifier pair, a shared inductor 404 may be used between differential ports, thereby connecting all positive ports together and all negative ports together, and reducing the number of ports between the driver amplifiers, 401, 402, 403 and the power amplifiers 405, 406, 407 to just two ports for the connection of the shared inductor 404. More specifically, a first end or port 404a of the inductor 404 may be commonly connected to respective positive ports provided by electrical paths 420, 430, 440. Likewise, a second end or port 404b of the inductor may be commonly connected to respective negative ports provided by electrical paths 421, 431, 441. The parallel amplification of power amplifiers 405, 406, 407 provided by the respective differential outputs may be combined by an output matching network 408 or other power combiner to generate a single-ended system output. It will be appreciated that in addition to performing impedance matching, the output matching network 408 may also comprise a balun for converting balanced, differential outputs to an unbalanced, single-ended output, according to an example embodiment of the invention. It will be appreciated that while inductor 404 has been illustrated as a single inductor, the inductor 404 can comprise essentially any two-port inductive device, according to an example embodiment of the invention. Indeed, the two-port inductive device may comprise multiple inductors in series and/or parallel without departing from example embodiments of the invention. It will also be appreciated that the driver amplifiers 401, 402, 403 and the power amplifiers 405, 406, 407 may be implemented with the shared inductor 404 in a single integrated circuit using CMOS technologies, according to an example embodiment. Similarly, the output matching network could also be implemented as part of the single integrated circuit as well without departing from example embodiments of the invention.

Figure 5:
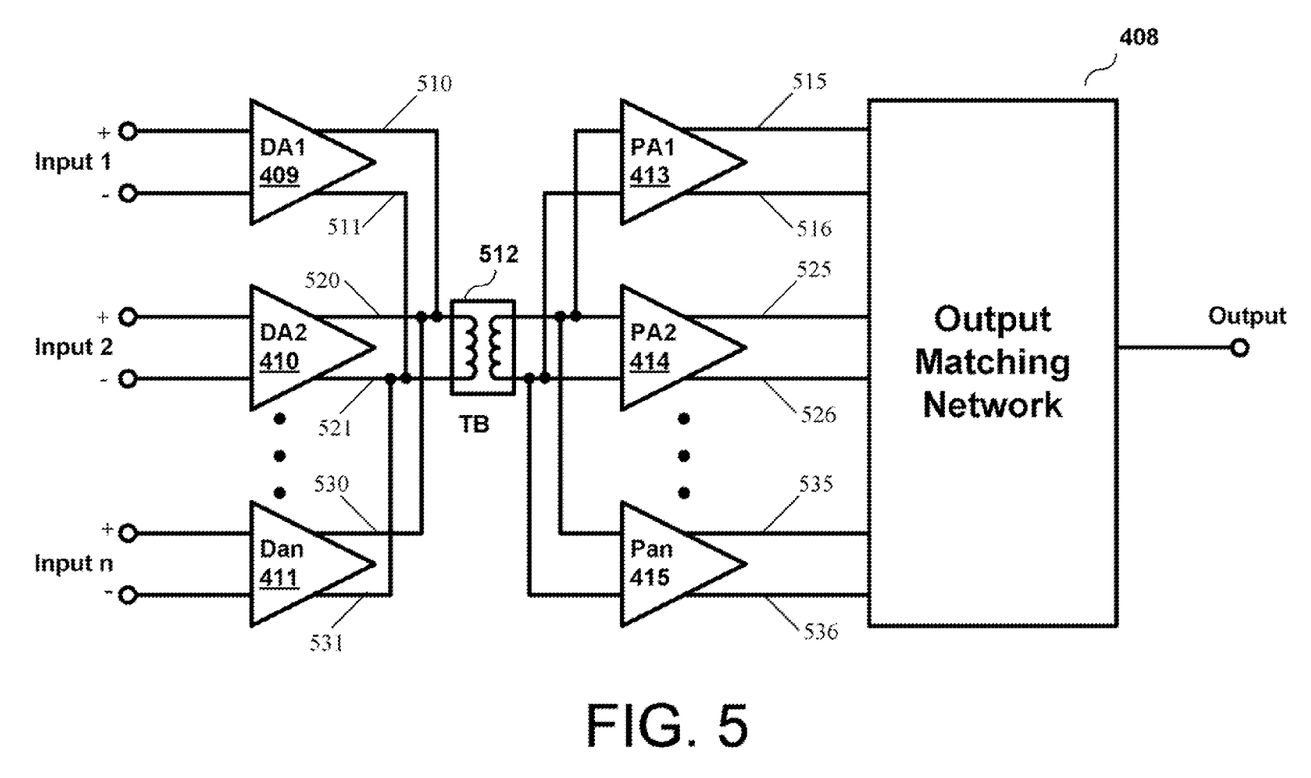
FIG. 5 illustrates an example power amplifier system in which a shared transformer is utilized for interstage matching for a plurality of parallel amplification paths, according to an example embodiment of the invention.

FIG. 5 illustrates an example embodiment in which a shared transformer 412 is utilized for interstage matching for a plurality of parallel amplification paths, according to an example embodiment of the invention. The driver amplifiers 410, 402, 403 and power amplifiers 405, 406, 407 are similar to those described with respect to FIG. 4. However, in FIG. 5, a shared transformer 512 may be utilized instead of a shared inductor 404. The shared transformer 512 may include a primary winding inductively coupled to a secondary winding. The primary winding may have a first port 512a and a second port 512b. Likewise, the secondary winding may have a first port 512c and a second port 512d.

In FIG. 5, the positive output ports of driver amplifiers 409, 410, 411 may be connected to the first end or port 512a of the primary winding via respective electrical connections 510, 520, 530. Likewise, the negative output ports of driver amplifiers 409, 410, 411 may be connected to the second end or port 512b of the primary winding via respective electrical connections 511, 521, 531. On the other hand, the first end or port 512c of the secondary winding may be connected to the positive input ports of power amplifiers 413, 414, 415. Similarly, the second end or port 512d of the secondary winding may be connected to the negative input ports of power amplifiers 413, 414, 415.

If the input ports of the power amplifiers PA1-n 405, 406, 407 are combined together as in FIG. 4 or FIG. 5, the input capacitance may be multiplied by the number n of parallel amplification as $C_{in}=n*C_n$ and this is the only capacitance required to be matched The operating frequency may be redefined as $f_o=1/(2*\pi*(C_n*L_n)^{1/2})=1/(2*\pi*(C_{in}/n*L_B*n)^{1/2})=1/(2*\pi*(C_{in}*L_B)^{1/2})$. To keep the same operating frequency, the required inductance may be reduced to $L_B=L_n/n$, and only one inductive element may be utilized. Thus, the total inductance for the suggested design may be $L_B=L_n/n=L_A/n^2$, which is a significant reduction in size of the interstage inductors.

Similarly, as illustrated in FIG. 5, a shared transformer 512 can be utilized in parallel between the driver amplifiers 409, 410, 411 and the power amplifiers 413, 414, 415. For example, the transformers 214, 215, 216 used for interstage matching in FIG. 2B can also be combined together to provide a shared transformer 512 as in FIG. 5. Since the required inductance for the power amplifiers, 413, 414, 415 can be implemented by the secondary winding of the transformers 114, 115, 116 for matching, if the inductance are combined together, the size of the interstage matching transformer 512 can be reduced in the same manner as provided for the shared inductor 404. Even with this reduction, the driving of the power stages are not much affected once the interconnection does not cause unwanted inductive or resistive parasitic elements.

It will be appreciated that while FIGS. 4 and 5 may explicitly illustrate only three parallel amplification paths, other embodiments may have fewer or more parallel amplification paths without departing from example embodiments of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A power amplifier system, comprising:
    a plurality of driver amplifiers, wherein each driver amplifier includes at least one respective input port and at least one respective output port, wherein each driver amplifier includes a respective positive output port and a respective negative output port;
    a plurality of power amplifiers, wherein each power amplifier includes at least one respective input port and at least one respective output port, wherein each power amplifier includes a respective positive input port and a respective negative input port; and
    a shared inductor that provides common interstage matching between the respective output ports of the plurality of driver amplifiers and the respective input ports of the plurality of power amplifiers, wherein the shared inductor includes a first port and a second port, wherein the first port of the shared inductor is connected to the positive output ports of the driver amplifiers and the positive input ports of the power amplifiers, wherein the second port of the shared inductor is connected to the negative output ports of the driver amplifiers and the negative input ports of the power amplifiers.

2. The system of claim 1, further comprising:
    a power combiner that receives inputs from the respective output ports of the plurality of power amplifiers, and generates a combined output.

3. The system of claim 2, wherein the power combiner is an output matching network.

4. The system of claim 2, wherein each power amplifier provides respective differential outputs, and wherein the output matching network comprises a balun for combining respective differential outputs from each of the plurality of power amplifiers into a single-ended output signal as the combined output.

5. The system of claim 1,
    wherein the plurality of driver amplifiers includes at least a first driver amplifier and a second driver amplifier, wherein the first driver amplifier includes a first differential output port and a second differential output port, and wherein the second driver amplifier includes a third differential output port and a fourth differential output port;
    wherein the plurality of power amplifiers includes at least a first power amplifier and a second power amplifier, wherein the first power amplifier includes a first differential input port and a second differential input port, and wherein the second power amplifier includes a third differential input port and a fourth differential input port; and
    wherein the first differential output port is connected to the first differential input port, the second differential output port is connected to the second differential input port, the third differential output port is connected to the third differential input port, and the fourth differential output port is connected to the fourth differential input port.

6. The system of claim 5, wherein the shared inductor includes a first end and a second end, wherein the first end of the shared inductor is connected to the first differential input port, the first differential output port, the third differential input port, and the third differential output port, and wherein the second end of the shared inductor is connected to the second differential output port, the second differential input port, the fourth differential output port, and the fourth differential input port.

7. The system of claim 1, wherein the shared inductor is configured to operate with input capacitance associated with the power amplifiers to generate resonance at an operational frequency.

8. The system of claim 1, wherein the power amplifiers are respective CMOS power amplifiers comprising at least a first cascade transistor stage and a second cascade transistor stage arranged for differential operation.

9. The system of claim 8, wherein the first cascade transistor stage comprises a first transistor and a second transistor, wherein the second cascade transistor stage comprises a third transistor and a fourth transistor, wherein respective gates of the first transistor and the third transistor receive respective differential inputs, and wherein respective drains of the second transistor and the fourth transistor provide respective differential outputs.

10. A power amplifier system, comprising:
    a plurality of driver amplifiers, wherein each driver amplifier includes at least one input port and at least one output port, wherein each driver amplifier includes a respective positive output port and a respective negative output port;

a plurality of power amplifiers, wherein each power amplifier includes at least one input port and at least one output port, wherein each power amplifier includes a respective positive input port and a respective negative input port; and a shared transformer that provides common interstage matching between the respective output ports of the plurality of driver amplifiers and the respective input ports of the plurality of power amplifiers, wherein the shared transformer comprises a primary winding inductively coupled to a secondary winding, the primary winding including a first port and a second port, the secondary winding including a third port and a fourth port, and wherein the first port of the primary winding is connected to the positive output ports of the driver amplifiers, wherein the second port of the primary winding is connected to the negative output ports of the driver amplifiers, wherein the third port of the secondary winding is connected to the positive input ports of the power amplifiers, wherein the fourth port of the secondary winding is connected to the negative input ports of the power amplifiers.

11. The system of claim 10, further comprising:
a power combiner that receives inputs from the respective output ports of the plurality of power amplifiers, and generates a combined output.

12. The system of claim 11, wherein the power combiner is an output matching network.

13. The system of claim 11, wherein each power amplifier provides respective differential outputs, and wherein the output matching network comprises a balun for combining respective differential outputs from each of the plurality of power amplifiers into a single-ended output signal as the combined output.

14. The system of claim 10,
wherein the plurality of driver amplifiers includes at least a first driver amplifier and a second driver amplifier, wherein the first driver amplifier includes a first differential output port and a second differential output port, and wherein the second driver amplifier includes a third differential output port and a fourth differential output port;

wherein the plurality of power amplifiers includes at least a first power amplifier and a second power amplifier, wherein the first power amplifier includes a first differential input port and a second differential input port, and wherein the second power amplifier includes a third differential input port and a fourth differential input port; and wherein the first differential output port is connected to the first differential input port, the second differential output port is connected to the second differential input port, the third differential output port is connected to the third differential input port, and the fourth differential output port is connected to the fourth differential input port.

15. The system of claim 14, wherein the shared transformer includes a primary winding inductively coupled to a secondary winding, the primary winding includes a first end and a second end, the secondary winding includes a third end and a fourth end, wherein the first end of the primary winding is connected to the first differential output port and the third differential output port, wherein the second end of the primary winding is connected to the second differential output port and the fourth differential output port, wherein the first end of the secondary winding is connected to the first differential input port and the third differential input port, and wherein the second end of the secondary winding is connected to the second differential input port and the fourth differential input port.

16. The system of claim 10, wherein the shared transformer is configured to operate with input capacitance associated with the power amplifiers to generate resonance at an operational frequency.

17. The system of claim 10, wherein the power amplifiers are respective CMOS power amplifiers comprising at least a first cascade transistor stage and a second cascade transistor stage arranged for differential operation.

18. The system of claim 17, wherein the first cascade transistor stage comprises a first transistor and a second transistor, wherein the second cascade transistor stage comprises a third transistor and a fourth transistor, wherein respective gates of the first transistor and the third transistor receive respective differential inputs, and wherein respective drains of the second transistor and the fourth transistor provide respective differential outputs.

* * * * *